United States Patent [19]

Gordon et al.

[11] Patent Number: 4,943,468
[45] Date of Patent: Jul. 24, 1990

[54] CERAMIC BASED SUBSTRATE FOR ELECTRONIC CIRCUIT SYSTEM MODULES

[75] Inventors: Robert J. Gordon, Coppell; Brian J. Love, Dallas; Robert K. Peterson, Garland; Burhan Ozmat, Dallas, all of Tex.

[73] Assignee: Texas Instruments Incorporated, Dallas, Tex.

[21] Appl. No.: 265,120

[22] Filed: Oct. 31, 1988

[51] Int. Cl.$^5$ ................................................ B32B 9/00
[52] U.S. Cl. .................................... 428/210; 428/209; 428/688; 428/691; 428/901; 174/258; 361/397
[58] Field of Search ............... 428/209, 210, 688, 698, 428/901; 174/68.5; 361/397

[56] References Cited

U.S. PATENT DOCUMENTS 4,426,423  1/1984  Intrater et al. ...................... 428/469

Primary Examiner—Patrick Ryan
Attorney, Agent, or Firm—Rene' E. Grossman; Melvin Sharp

[57] ABSTRACT

An electronic system having a first printed wiring board, a first integrated circuit carrier positionable on the printed wiring board and a substrate having a central portion formed of ceramic material. The substrate central portion has a specific thermal conductivity greater than $1.5 \times 10^{-5}$ Wm$^2$/g°C. The substrate may comprise a ceramic material formed in combination with a modifier of the type which increases fracture toughness thereby inhibiting crack initiation and growth. In an alternate form of the invention the elctronic system includes a substrate having a central portion formed of ceramic material and first and second opposing surfaces each clad with a metallic layer of predetermined thickness. The combination of the substrate and the bonded wiring boards provide an effective coefficient of thermal expansion to each wiring board which is sufficiently close to the coefficient of thermal expansion of the carriers so as to prevent solder joint cracking during operation of the system.

23 Claims, 7 Drawing Sheets

CERAMIC BASED SUBSTRATE FOR ELECTRONIC CIRCUIT SYSTEM MODULES

FIELD OF THE INVENTION

This invention relates to heat dissipating substrates of the type used for mounting printed wiring boards and, more particularly, to substrates comprising compositions which may be tailored to provide a desired coefficient of thermal expansion.

BACKGROUND

High density electronic systems such as the types developed for aerospace applications are normally formed of standard sized two sided electronic circuit modules typically having over 25 in$^2$ of printed wiring board area on each side. These circuit modules require a combination of mechanical and thermal properties which enable the system to tolerate extensive thermal cycling and environmental stress without electronic failures. Differences in material properties among the various components in a module can lead to such failures during normal operation.

For example, integrated circuits are often packaged in leadless ceramic chip carriers formed of aluminum oxide ($Al_2O_3$). Differences in the coefficient of thermal expansion (CTE) of a chip carrier and the printed wiring board to which it is attached ca lead to cracking of the intervening solder joints. Normally the printed wiring board is made of a low modulus or compliant material, e.g., an epoxy-glass fiber composite, which is bonded to a relatively stiff substrate such as a composite metallic structure. Thus the thermal expansion characteristics of the compliant printed wiring board are influenced significantly by the properties of the underlying substrate.

Problems of differential thermal expansion become magnified as the density of circuit components increases. With surface mount, i.e., leadless chip, carrier technology component and interconnect spacings are very small. For example, over 60 ceramic integrated circuit carriers may be mounted on each side of a six inch square substrate. As the amount of power dissipated per unit area increases a greater amount of heat is transmitted through the printed wiring board to the underlying substrate. Such high wattage circuit board modules may exceed 2.5 W/in$^2$. Prior substrate designs have avoided component failures which might result from this excessive heat generation by limiting the power density and by attempting to match the CTE of the substrate material with that of the chip carrier over a large temperature range to avoid solder joint failure Vibration is a common environmental problem which can cause failures in high density electronic systems. For example, high levels of alternating bending and shear stresses are induced on solder joints during module vibration. These stresses can result in premature failures of solder joints. Because the amplitudes of these vibration responses are a function of material stiffness one answer to this problem has been to increase stiffness by forming thicker substrates. For large modules, e.g., having 36 in$^2$ of printed circuitry on each side, copper-Invar-copper substrates with thicknesses of 100 mils or more have been necessary to assure solder joint reliability in severe vibration environments. Another solution for mitigating the vibrational problems has been the introduction of structural stiffeners to increase the overall rigidity of the module. While attachment of such stiffeners may allow for a slimmer substrate, this approach increases fabrication time and cost. It also reduces the power dissipation level as well as available space for integrated circuits.

Conventional high power circuit board modules have successfully used bimetallic structures such as copper-Invar-copper or copper-molybdenum-copper systems to satisfy requirements for stiffness and thermal conductivity. The thickness of the relatively thin copper layer may be varied in order to match the CTE of the composite substrate with that of the chip carrier. The central Invar layer is formed of sufficient thickness to reduce vibrations which may cause solder joint fatigue. However, the high density of these metal based systems results in very heavy modules when, at the same time, overall system weight is a competing design constraint which limits the allowable thickness of the module.

Furthermore, since the Invar layer has a relatively low thermal conductivity each copper layer forms the primary path for dissipating heat generated by components on one side of the substrate. Thus in higher power systems a relatively thick metal layer is necessary to effectively dissipate the heat. This poses another competing design constraint, i.e., in applications where it is necessary to reduce the copper to Invar thickness ratio in order to more closely match the CTE of the substrate with that of the chip carriers.

While it might appear desirable to form the substrate from the same material as the chip carrier in order to better match the CTEs, most chip carriers are formed of aluminum oxide which is a brittle ceramic having marginal thermal conductivity. The brittle nature of the material make it highly susceptable to fracture during manufacture and handling.

Generally, it is the desire of the art to increase the density of electronic circuitry and to further minimize the overall size and weight of electronic systems. Problems of heat dissipation, differential thermal expansion and vibrational stress are limiting factors which have resulted in thick substrates formed of very dense materials. It would be advantageous to provide a relatively lightweight and high stiffness, high thermal conductivity substrate capable of accomodating a higher density of integrated circuits without further increasing the overall size and weight of the circuit module.

SUMMARY OF THE INVENTION

According to the invention there is provided an electronic system having a first printed wiring board, a first integrated circuit carrier positionable on the printed wiring board and a substrate having a central portion formed of ceramic material. The substrate central portion has a specific thermal conductivity greater than $1.5 \times 10^{-5}$ Wm$^2$/g°C. The substrate includes a first surface with the printed wiring board mounted thereon. Preferably, the system includes a second printed wiring board, the substrate includes a second surface with the second wiring board mounted thereon, and the substrate central portion has a specific thermal conductivity greater than $4 \times 10^{-5}$ Wm$^2$/g°C. In certain embodiments the central portion of the substrate comprises one or more materials taken from the group containing silicon carbide, aluminum nitride, beryllium oxide and boron nitride. The substrate may comprise a ceramic material formed in combination with a modifier of the type which reduces point contact stress levels, thereby inhibiting crack growth.

In an alternate form of the invention the electronic system includes a substrate having a central portion formed of ceramic material and first and second opposing surfaces each clad with a metallic layer of predetermined thickness. One or more printed wiring boards are bonded to each substrate surface. A plurality of integrated circuit carriers are each soldered to a printed wiring board. The combination of the substrate and the bonded wiring boards provide an effective coefficient of thermal expansion to each wiring board which is sufficiently close to the coefficient of thermal expansion of the carriers so as to reduce solder joint stress and strain during operation of the system.

Preferably the effective coefficient of thermal expansion of each bonded wiring board is sufficiently close to that of the carrier so as to minimize stresses and strains which could result in solder joint cracking during thermal cycling of the system at least from −10° C. to 50° C., and preferably from −55° C. to 125° C. In certain embodiments the above noted result is provided with a metallized ceramic substrate having tailorable coefficient of thermal expansion, a high thermal conductivity, a high resistance to vibration loadings, and a lower density than prior known substrates. In a preferred form the substrate has a high fracture toughness (more than 9 Kpsi(in.)$^{\frac{1}{2}}$) and small size defects (less than 10 micrometers) in order to withstand high stresses without exhibiting brittle failures.

BRIEF DESCRIPTION OF THE DRAWINGS

The invention may best be understood by reference to the following detailed description when read in conjunction with the drawings, wherein.

Certain preferred embodiments of the invention are disclosed herein. However, it should be appreciated that the specific materials, dimensions and systems applications disclosed herein are merely illustrative and do not delimit the scope of the invention.

DETAILED DESCRIPTION OF PREFERRED EMBODIMENTS

A reduction in the thickness and density of the heat dissipating substrate can result in lighter weight and more compact high power circuit modules. In the past, such a weight reduction would have required a reduction in overall system performance, e.g., by reducing the resonant vibrational frequency, the stiffness or the rate of heat dissipation of the substrate. Furthermore, if a prior art substrate such as a copper-Invar-copper composite were merely slimmed down to reduce the overall module weight, the effective, i.e., composite, coefficient of thermal expansion, $CTE_{eff}$ would increase in proportion to the ratio of printed wiring board volume to substrate volume. Generally, for a multilayer structure $$CTE_{eff} = \frac{\sum_i (CTE_i \times E_i \times V_i)}{\sum_i (E_i \times V_i)}$$

wherein
$CTE_i$ is the CTE of each layer material,
$E_i$ is the modulus of elasticity for each layer material, and
$V_i$ is the volume of each layer.

Figure 1:
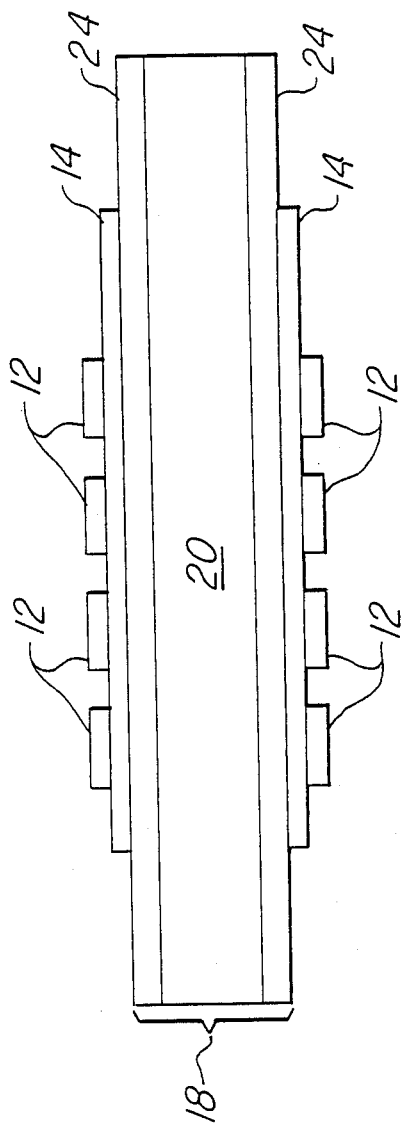
FIG. 1 illustrates a circuit module constructed according to the invention.

With reference to FIG. 1 there is illustrated an electronic system comprising a circuit module 10 according to the invention. Generally, it is to be understood that a plurality of such modules 10 may be assembled with one another to form a complex electronic system. In this example each module includes a plurality of ceramic integrated circuit carriers 12 each attached to one of two printed wiring boards 14. For high density, high power circuitry the carriers 12 are preferably of the surface mount variety and may contain monolithic or hybrid circuit structures. Typically, the physical size of the carriers ranges up to 1.15 in. by 1.15 in. Larger size carriers may be used with the invention. Each board 14 is bonded with an adhesive or resin, e.g., a glass fiber-epoxy or other resin such as a polyimide, to one side of a substrate 18. Other module designs may include a multiplicity of smaller printed wiring boards mounted to each side of the substrate, or, one or more printed wiring boards mounted on only one side of the substrate.

The substrate 18 comprises a central ceramic core 20 clad on one or both sides with a metal layer 24. Although ceramic materials are known to have relatively low densities and high stiffness, prior art circuit module substrates have not been formed with ceramics because they have been regarded as brittle and difficult to tool. Thus if a ceramic such as Al2O3 were formed into a large, thin substrate, e.g., 6" by 6" by 0.10" to accomodate large printed wiring boards, it would be highly susceptible to breakage. Furthermore, most common ceramics such as, for example, aluminum oxide and glasses are poor thermal conductors.

According to the invention it is now recognized, notwithstanding requirements for fracture toughness, that substrates having superior performance characteristics compared with metal based systems can nonetheless be formed with ceramic materials. Although many ceramic compositions have relatively poor thermal conductivities, K, the specific thermal conductivity, $K_s$, i.e., thermal conductivity per unit density, of several ceramics is superior to that of some metals.

In the preferred embodiments a substrate core 20 is formed with one of these materials and one or both sides of the core 20 are clad with a metal layer 24. This combination provides a composite system having greater fracture toughness than that of the ceramic core alone. In fact, with appropriate selection of the ceramic material the substrate will exhibit an overall higher specific thermal conductivity, a greater stiffness and a lower density than a comparable copper-Invar-copper system. Thus the substrate 18 can provide equivalent o better thermal and environmental performance while weighing less than a substrate formed with an Invar core. Furthermore, for a given density and thermal conductivity the resulting substrate 18 may also be sized to occupy less volume than prior art substrates.

In a first embodiment of the invention the core is formed from the class of ceramic materials having a relatively high specific thermal conductivity, i.e., $K_s > 3 \times 10^{-5}$ Wm$^2$/g°C., although ceramics having $K_s$ values as low as $1.5 \times 10^{-5}$ Wm$^2$/g°C. will be useful for practicing the invention. Preferred materials include silicon carbide ($K_s = 3.9 \times 10^{-5}$ Wm$^2$/g°C. aluminum nitride ($K_s = 5.2 \times 10^{-5}$ Wm$^2$/g°C.), beryllium oxide ($K_s = 8.7 \times 10^{-5}$ Wm$^2$/g°C., and boron nitride ($K_s = 3.2 \times 10^{-5}$ Wm$^2$/g°C.). Composition of the layers 24 includes materials chosen from the group of metals and alloys thereof which bond well with the ceramic and which are malleable to the extent that they reduce point contact stresses on the underlying ceramic. Aluminum, nickel, copper and magnesium are examples of metals which render the composite system less brittle. Choice of an appropriate metal or alloy for layer 24 will depend on desired values of density, specific thermal conductivity, thickness and composite CTE.

The CTE of the metallized ceramic substrate 18 may be tailored to prevent differential thermal expansion relative to the chip carriers 12. This is accomplished by varying the thickness of the metal layers 24 relative to the ceramic core. In combinations where the CTE of the ceramic layer 18 is less than that of the chip carrier, the chosen metal has a CTE greater than that of the chip carrier. According to principles known in the art, the thickness of the metal layers 24 relative to the thickness of the ceramic core may be varied to provide a desired CTE for the composite substrate. For a given metal layer, the differential expansion of the metal relative to the core 20 is approximately elastic up to a characteristic temperature limit which will vary as a function of the layer thickness for each metal. Thus a feature of the first embodiment is that the role of the metal layer as a conductive heat path can be of lesser significance than in prior art substrates such as those formed with metal clad Invar.

Both the tailored CTE of the substrate 18 and the range of elasticity of the metal layer are directly related to the layer thickness. With the limited number of pure metals available it will not always be possible to obtain a desired CTE while maintaining metal elasticity over a desired temperature range. In contrast, many alloys exhibit a higher yield stress than the metals from which they ar formed. Thus for a given thickness ratio of metallic layer to ceramic core, the choice of an alloy for the layers 24 may provide a more desirable combination of CTE and elasticity for a given metal thickness. This will be particularly desirable when a relatively thin metallic layer 24 is needed to influence the CTE of the ceramic over a large temperature range. Several alloys of aluminum should be considered when forming relatively thin metallic layers, including 2024 (4.5% copper, 1.5% Mg, 0.6% Mn), and 6061 (1.0% Mg, 0.6% Si, 0.25% Cu and 0.25% Cr). Properties of these and other alloys are discussed in Vol. 1 of *Metals Handbook*, 8th Ed., published by the American Society For Metals (1961).

Figure 2:
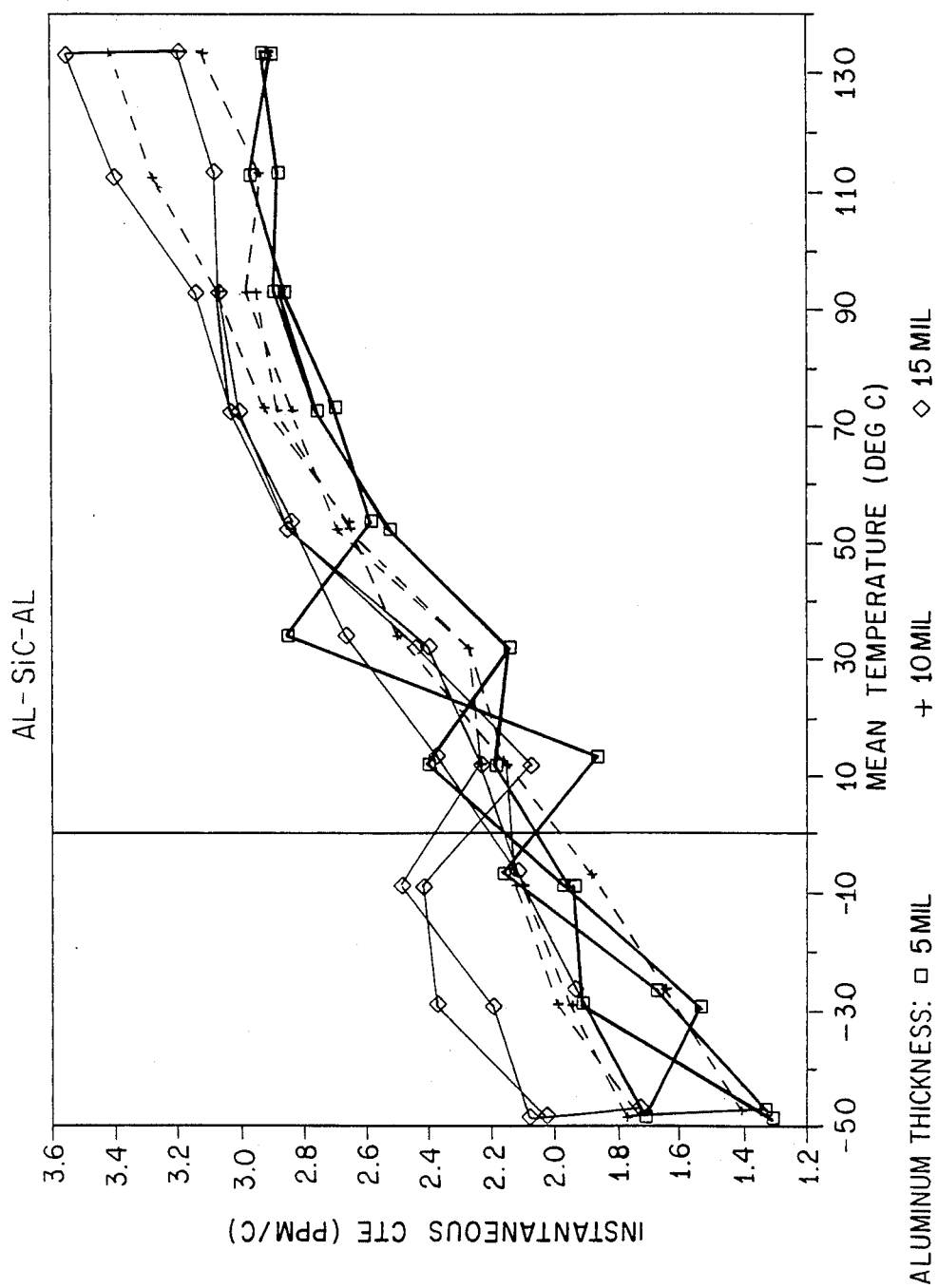
FIG. 2 presents, for an exemplary substrate according to a first embodiment of the invention, measured hysteresis curves of the instantaneous CTE.

An exemplary substrate 18 according to the first embodiment may be formed with a silicon carbide or aluminum nitride ceramic core 20 clad on each side with an aluminum metal layer 24. FIG. 2 illustrates measured hysteresis curves for the CTE (instantaneous) as a function of temperature for a silicon carbide/aluminum substrate having a core layer thickness of 0.100 in. and three different metal layer thicknesses: 0.005 in.; 0.010 in.; and 0.015 in. Inplane data is presented for orthogonal X and Y directions. When normalized to the material density, the specific thermal conductivity of this composite substrate is estimated to be approximately $5.2 \times 10^{-5}$ Wm$^2$/g°C., nearly three times greater than the normalized thermal conductivity achievable with a copper-Invar-copper substrate that is comparably dimensioned.

Figure 3:
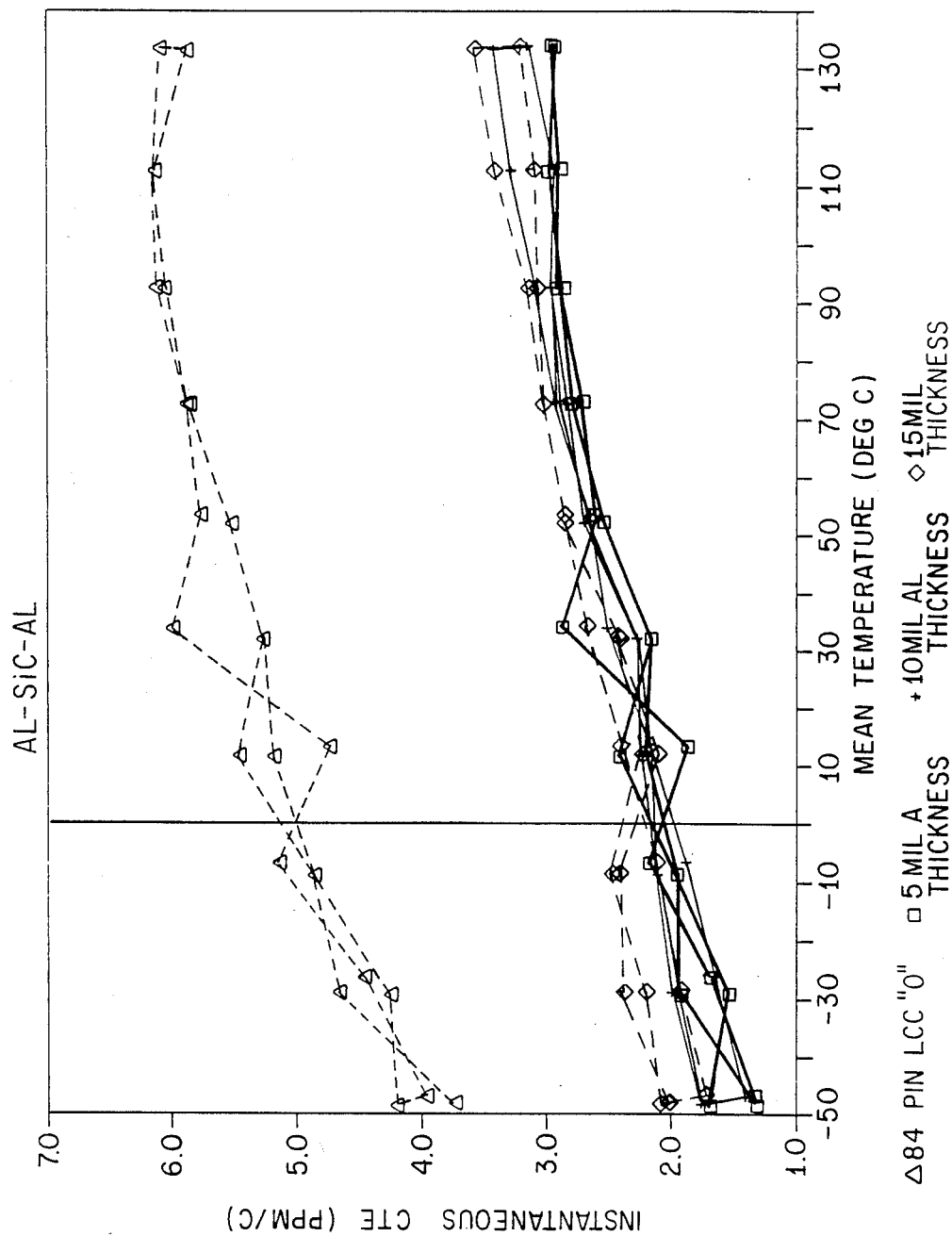
FIG. 3 displays measured CTE data for an IC carrier.

FIG. 3 displays the measured CTE (instantaneous) for an 84 pin aluminum oxide surface mount, i.e., leadless, chip carrier (LCC). The data of FIG. 2 is represented in FIG. 3 to illustrate that the CTE of the first embodiment exemplary substrate parallels that of the chip carrier at least to within 3 parts per million per degree Centigrade over a temperature range between −50° C. and 130° C.

A feature of the first embodiment is that the role of the metal layer as a conductive heat path can be of lesser significance than in prior art substrates such as those formed with metal clad Invar. This is because the ceramic core has a high specific thermal conductivity, i.e., the ratio of thermal conductivity to density is 286 percent that of a comparable copper-Invar-copper system.

According to a second embodiment of the invention the core 20 comprises a ceramic material in combination with a modifier to render the combination less brittle than the ceramic and thus less susceptible to fracture during tooling and handling processes. The modifier increases the fracture toughness of the ceramic substrate 18 and inhibits crack growth. The metal layer 24 is selected from the group of metals and alloys thereof which bond well with the underlying ceramic. Malleability, although not essential, is a desirable feature of the metal to the extent that it further enhances the fracture toughness of the composite substrate 18 and reduces point contact stresses on the underlying ceramic. Aluminum, nickel and copper are examples of suitable metals.

In addition to advantages noted with regard to the first embodiment, the second embodiment provides the further feature that the metal layer 24 is not needed to increase the fracture toughness of the composite. Thus it may be thinned to provide a desired CTE without significantly altering other important performance parameters of the composite substrate 18.

Figure 4:
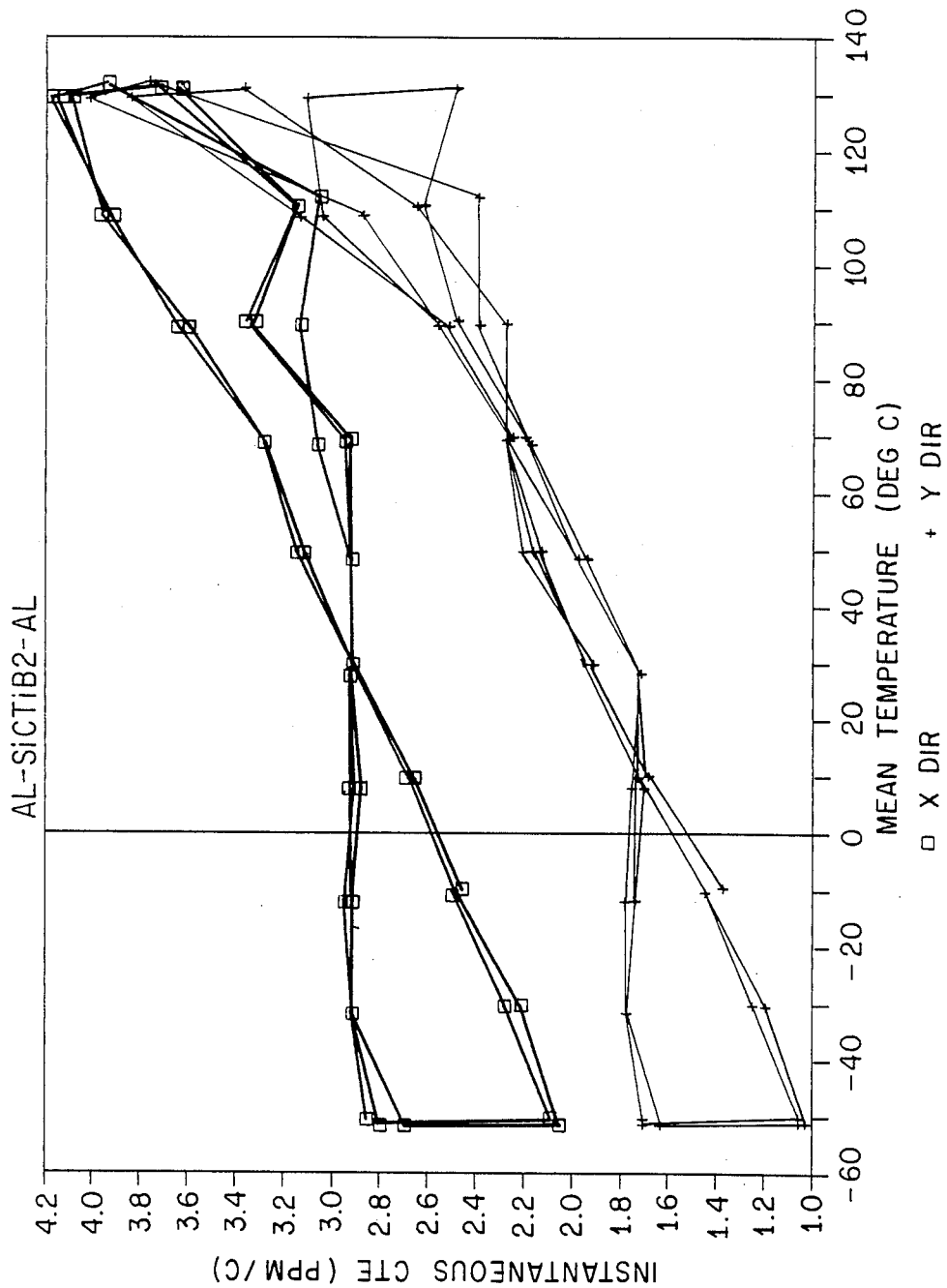
FIG. 4 presents, for an exemplary substrate according to a second embodiment of the invention, measured hysteresis curves of the instantaneous CTE.

An example of a ceramic material in combination with a modifier to form the second embodiment of the substrate 18 is a blend of silicon carbide and titanium diboride ($TiB_2$). FIG. 4 illustrates measured hysteresis curves for the CTE (instantaneous) as a function of temperature for such a substrate 18 having a 0.0125 in. Al layer formed on each side of a 0.050 in. thick core 20. In-plane data is presented for orthogonal X and Y directions. In this example the core comprises 80 percent silicon carbide and 20 percent titanium diboride. The titanium diboride core modifier concentration may range up to 30 percent or higher to provide desired ceramic properties. The concentration ranges for other modifiers may differ. Possible choices for alternate modifier materials include beryllium oxide and boron nitride.

Figure 5:
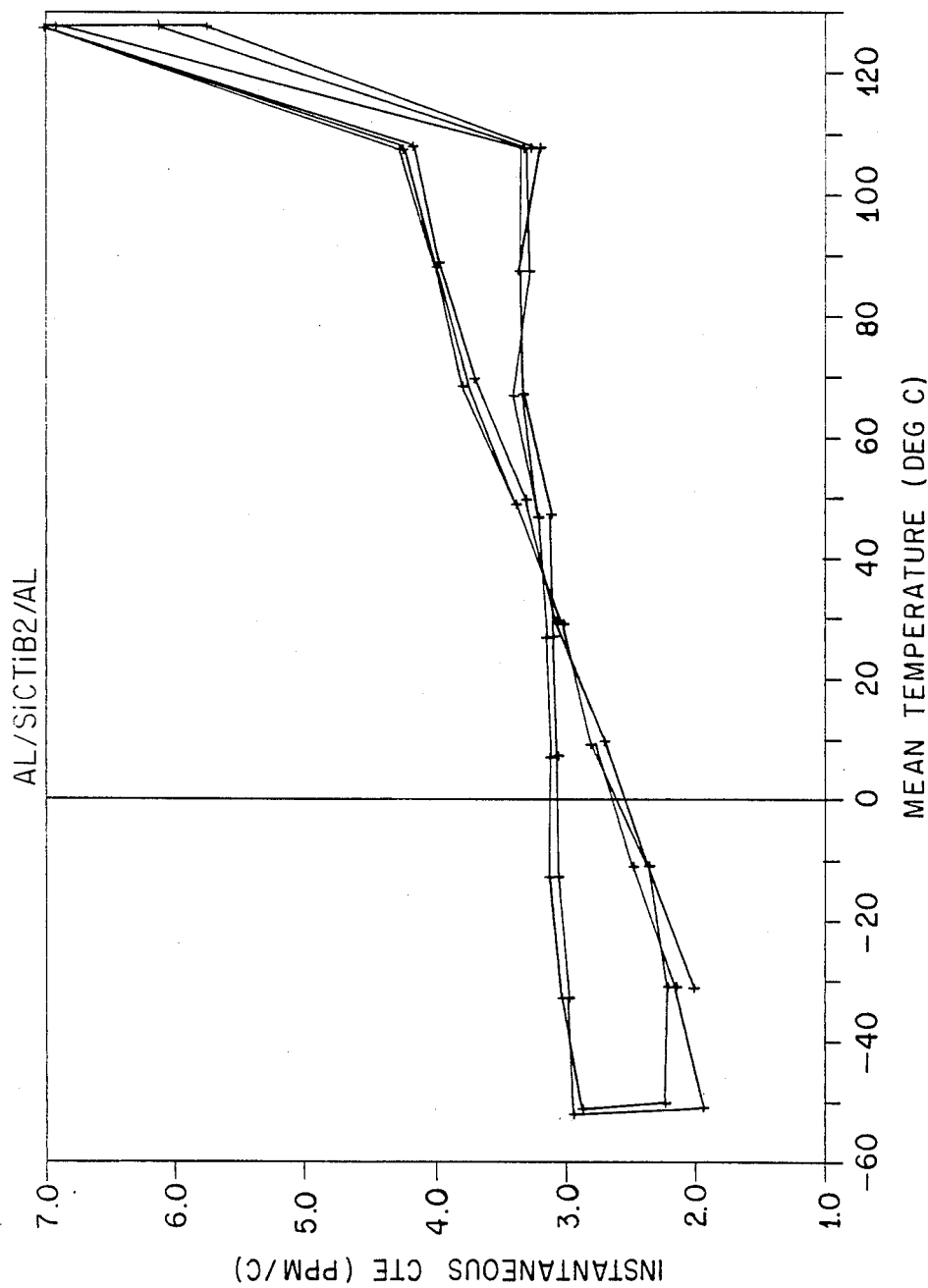
FIG. 5 illustrates hysteresis curves for the CTE of a demonstration circuit module constructed according to the second embodiment of the invention.

FIG. 5 displays the measured temperature hysteresis curves for the CTE (instantaneous) of a demonstration circuit module 10 according to the second embodiment wherein a simulation wiring board was bonded to each side of a substrate 18. The simulation board, which corresponded to a polymer based printed wiring board contained eight levels of circuit interconnect. The substrate was identical to the one described with reference to FIG. 4. In-plane data along one direction confirms a close match with the CTE of the 84 pin aluminum oxide surface mount chip carrier of FIG. 3, e.g., an average deviation within about 1.6 parts per million, or a maximum deviation less than 3 parts per million, per degree Centigrade over a temperature range between −50° C. and 130° C. By reducing the porosity of the metallic layer 24 and by using metal alloys, e.g., 6061 Al, or 2024 Al, it is anticipated that the CTE of the wiring board/substrate combination can be tailored to within 0.5 parts per million per degree Centigrade of the carrier 12.

Figure 6:
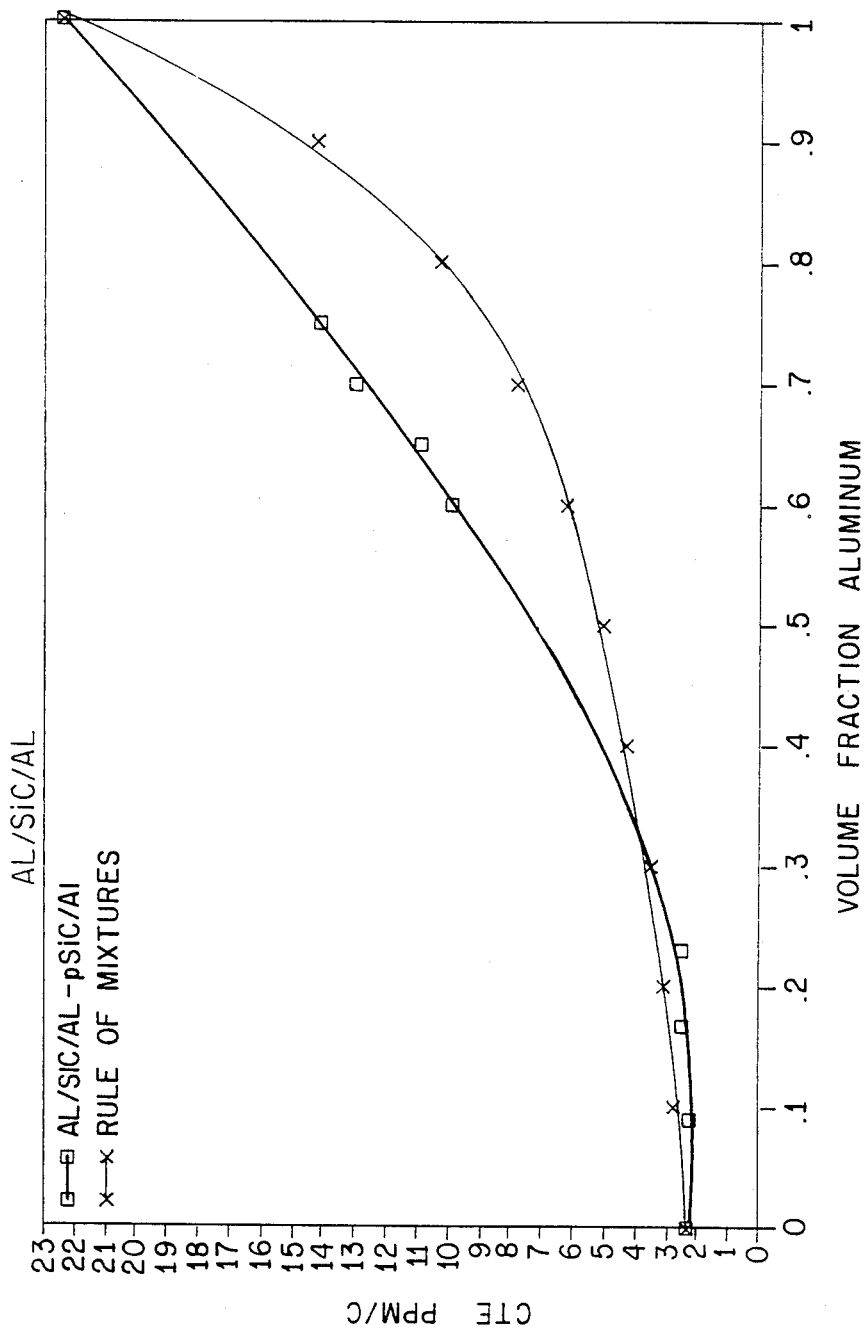
FIG. 6 compares the measured and theoretical CTE of a substrate according to the second embodiment of the invention.

For the second embodiment substrate 18 formulated with aluminum metallic layers, 80 percent silicon carbide and 20 percent titanium diboride, FIG. 6 compares the measured and theoretical CTE (average) as a function of the volume fraction of layer 24 relative to core volume. CTE average values are based on instantaneous values between −50° C. and 130° C.

Figure 7:
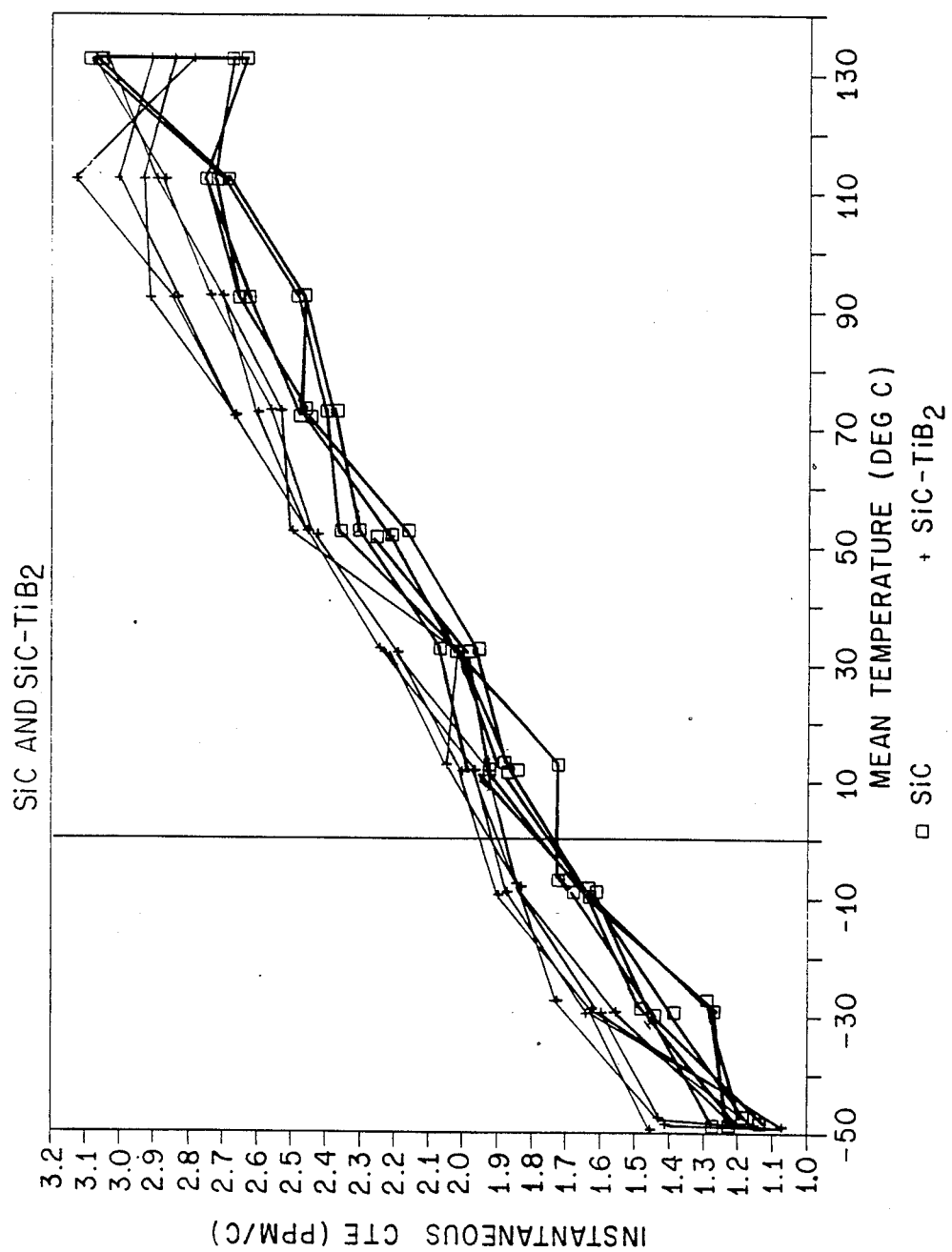
FIG. 7 illustrates measured CTE hysteresis curves for an unclad core according to a third embodiment of the invention.

In a third embodiment of the invention the substrate 18 is formed of a ceramic material without a cladding layer 24. Among other applications this embodiment is useful when the integrated circuit carrier material is formed of substantially the same ceramic as the substrate 18. For example, the substrate 18 and the carriers 12 could all be formed of silicon carbide, one of the less brittle ceramic materials; or, the carriers 12 could be silicon chip carriers housing silicon integrated circuits on the substrate 18. Alternatively a ceramic having acceptable thermal conductivity could be combined with a modifier such as titanium diboride to form both the substrate 18 and the carriers 12. FIG. 7 illustrates measured CTE (instantaneous) hysteresis curves as a function of temperature for an unclad core formed of silicon carbide and for an unclad core comprising a blend of 80 percent silicon carbide and 20 percent titanium diboride. The blend has a specific thermal conductivity of $33.3 \times 10^{-6}$ W/gm$^2$°C.

Forming the carriers 12 with a ceramic material having a relatively high thermal conductance, as compared to that of aluminum oxide, may further reduce the thermal requirements of the substrate 18. This is because a lower thermal resistance in the carrier could reduce the resistance of heat flow from the carrier to the substrate 18. This in turn would reduce the operational temperature of the carrier.

Fabrication of the circuit module 20 may begin with either a sintered or unsintered core 20 of desired ceramic composition. Such core materials formed of silicon carbide as well as various blends of silicon carbide and titanium diboride are available under the trade names Hexaloy SA and Hexaloy ST, respectively, from the SOHIO Corporation Structural Ceramics Division, P.O. Box 1054 Niagara Falls, N.Y., U.S.A. 14302. Hexaloy ST may be tooled after being sintered into a monolithic body by electrostatic discharge machining (EDM) or with diamond cutting tools. Methods for producing such sintered ceramic cores or substrates are well known in the art. See, for example, U.S. Pat. Nos. 4,312,954 and 4,327,186 which are hereby incorporated by reference.

Generally, the unsintered core, known in the art as a green body, is formed by mixing powdered silicon carbide with carbonizable, organic solvent soluble, organic material (ranging from 0.67 to about 20 parts by weight) and with organic polymers and a sintering agent. Powder granules can be on the order of two microns in size, but submicron dimensions are preferable. The polymer serves as a temporary binder and may be polyethylene glycol or polyvinyl alcohol with water as the vehicle. For example, the temporary binder may consist of 10 percent polyvinyl alcohol and 90 percent water. Boron and boron carbide are suitable sintering agents.

The raw batch may contain 91 to 99 percent parts by weight silicon carbide; from about 0.67 to about 20 parts by weight carbonizable organic material, e.g., coal tar pitch or aluminum stearate; and from about 5 to 15 parts by weight temporary binder. Thorough mixing is desired to distribute the carbonizable material about the silicon carbide. The stirred mixture is dried and shaped to form a billet having a density of at least 1.60 g/cc, e.g., by isostatic pressing or compression. If compression is used preferred pressures range between 16,000 and 20,000 psi.

Individual slices are cut from the billet to form green bodies which are readily deformable, yet of satisfactory integrity for tooling. Preferably, at this point in the process the sample is shaped, tooled and drilled as necessary to meet the physical and electrical requirements of the final substrate. Although tooling and other forms of cutting could be performed after the ceramic is sintered, this is more difficult and increases the susceptibility of the sample to damage. Sizing of the tooled sample should take into account shrinkage on the order of 17-20 percent after sintering. Subsequent to tooling the sample is gradually heated, preferably for at least one to two hours to pyrolize the organic binder. Thereupon the firing takes place for 20 to 60 minutes in an inert atmosphere at 2,000° C. to 2,200° C. to produce a sintered ceramic substrate 18.

According to the second embodiment, the substrate may include a modifier in which case a powdered form of the modifier, preferably submicron granules, is intimately blended with comparably sized silicon carbide granules to create a homogeneous mixture when forming the raw batch. For silicon carbide—titanium diboride compositions 20 percent titanium diboride is preferred in order to provide an adequate thermal conductivity and a satisfactory level of fracture toughness while retaining the ability to tool the sintered product by EDM.

Next, according to the first and second embodiments the core surfaces are clad with metallic layers of predetermined thicknesses s that the combination of the wiring boards and the substrate provide an effective coefficient of thermal expansion which is sufficiently close to that of the integrated circuit carrier so as to prevent solder joint cracking during circuit operation. Several well known deposition and plating techniques, such as, for example, plasma spraying or flame spraying, may be adapted for coating the core with a desired metal or alloy. A preferred method is ion vapor deposition (IVD). Methods and apparatus for plating work pieces by IVD techniques are described in U.S. Pat. Nos. 3,926,147, 4,116,161, and 4,233,937 all of which are incorporated herein by reference.

A general process flow for IVD formation of the metal layers begins with sandblasting the sintered core surfaces to remove oxides and assure a clean surface for metal bonding. The core is then washed with acetone or another organic solvent and placed in a IVD chamber which is evacuated and then filled with an inert gas such as argon, e.g., to 10 microns of Hg. A potential, e.g., 2000 volts, is applied for several minutes to sputter clean the core surface. Next, a metal such as aluminum or an alloy is evaporated and ion deposited on the ceramic surface until a desired metal thickness is attained.

It may be desirable to provide corrosion protection and electrical isolation to the resulting core 20. This may be accomplished, for example, by electroless nickel plating to less than 0.005 in., or by anodization.

Modifications and Advantages

There has been presented a ceramic substrate having material properties suitable for forming high density circuit modules. It has been illustrated that ceramics can be used to form light weight heat sinks and that metallized ceramics can be formed with tailorable coefficients of thermal expansion by varying the volume fraction of metal on the surface. Thus the thermal expansion characteristics of the substrate having circuit boards mounted thereon can be made to closely match the thermal expansion characteristics of the chip carriers.

The exemplary embodiments are well suited for minimizing strain on solder joints during vibration loading as well as thermal shock testing. For example, the module 10 according to the first embodiment, when formulated as described with reference to FIG. 5, exhibits a minimum resonant vibration frequency greater than 460 Hz. This data was acquired by imparting a sinusoidal frequency sweep to a module 10 with a shaker table at acceleration levels of one and five times gravity.

The concepts disclosed herein could also be applied to hybrid integrated circuitry by replacing the structure upon which the integrated circuits are mounted with the substrate 18 of the present invention. Often the structures upon which prior art hybrid circuits are mounted are poor thermal conductors and relatively brittle. These properties result in durability problems. With the substrate 18 according to the first and second embodiments the overall specific thermal conductivity may be further increased while also improving durability.

Another feature of the invention is that the substrate thickness may be further reduced according to the first and second embodiments when the thickness and composition of the metallic layer is optimized for thermal conductivity. In this application the core thickness is based primarily on structural parameters. Furthermore, because the core 20 is exhibits good thermal conductivity, heat generated on one side of the substrate is not restricted to a path along one side of the core. Rather, the heat can conduct through the core as well as along the metallic layer on the other side of the substrate 18. This enables heat to dissipate more evenly throughout the substrate.

Certain preferred embodiments of the invention have been described. Various other arrangements and configurations of the disclosed embodiments and components thereof will be apparent and various parameters may be optimized to suit desired purposes. Accordingly, the scope of the invention is only to be limited by the claims which follow.

We claim:

1. An electronic system comprising:
    (a) a first printed wiring board;
    (b) a first integrated circuit carrier disposed on and secured to said printed wiring board; and
    (c) a substrate having a central portion formed of ceramic material, said central portion having a specific thermal conductivity greater than $15 \times 10^{-6}$ Wm$^2$/g°C., said substrate including a fist surface, said printed wiring board being secured to and coplanar with said first surface.

2. The system of claim 1 including a second printed wiring board, said substrate including a second surface with the second wiring board mounted said second surface, said central portion having a specific thermal conductivity greater than $40 \times 10^{-6}$ Wm$^2$/g°C.

3. The system of claim 1 wherein the central portion of said substrate comprises at least one material taken from the group containing silicon carbide, aluminum nitride, beryllium oxide and boron nitride.

4. The system of claim 1 wherein said central portion of said substrate further comprises in combination with said ceramic material a modifier which increases the fracture toughness of said substrate to inhibit crack initiation and growth of said substrate.

5. The system of claim 4 wherein the modifier is titanium diboride.

6. The system of claim 5 wherein the central portion of said substrate comprises silicon carbide and titanium diboride.

7. The system of claim 5 wherein the central portion of said substrate comprises 80 percent silicon carbide and 20 percent titanium diboride.

8. The system of claim 1 wherein:
    the first printed wiring board is bonded to the first surface of said substrate and the first integrated circuit carrier is soldered to the printed wiring board; and
    the effective coefficient of thermal expansion of the bonded wiring board is either identical with or sufficiently close to that of the carrier so as to prevent solder joint cracking during thermal cycling of the system.

9. The system of claim 7 wherein the effective coefficient of thermal expansion of the bonded wiring board is sufficiently close to that of the carrier so as to prevent solder joint cracking during thermal cycling of the system from −65° C. to 125° C.

10. An electronic system comprising:
    a substrate having a central portion formed of ceramic material and first and second opposing surfaces each surface clad with a metallic layer of predetermined thickness;
    one or more printed wiring boards bonded to each substrate surface;
    a plurality of integrated circuit carriers each soldered to a printed wiring board, the combination of said substrate and said bonded wiring boards providing an effective coefficient of thermal expansion to each wiring board which is sufficiently close to the coefficient of thermal expansion of the carriers so as to prevent solder joint cracking during operation of the system.

11. The system of claim 10 wherein the effective coefficient of thermal expansion of each bonded wiring board is sufficiently close to that of the carrier so as to prevent solder joint cracking during thermal cycling of the system from −10° C. to 50° C.

12. The system of claim 10 wherein the effective coefficient of thermal expansion of each bonded wiring board is sufficiently close to that of the carrier so as to prevent solder joint cracking during thermal cycling of the system from −55° C. to 125° C.

13. The system of claim 10 wherein the ceramic central portion of said substrate is formed of silicon carbide and each metallic layer is aluminum.

14. The system of claim 10 wherein the ceramic central portion of said substrate is 0.05 in. thick and each metallic layer is 0.0125 in. thick, said substrate having a specific thermal conductivity greater than $4 \times 10^{-5}$ Wm$^2$/g°C.

15. The system of claim 14 wherein said substrate has a specific thermal conductivity of approximately $5.2 \times 10^{-5}$ Wm$^2$/g°C.

16. The system of claim 10 wherein said substrate is characterized by a composite specific thermal conductivity greater than $3 \times 10^{-5}$ Wm$^2$/g°C.

17. The system of claim 10 wherein the metallic layers each comprise one or more metals taken from the group consisting of aluminum, copper, nickel and magnesium.

18. The system of claim 10 wherein the central portion of said substrate comprises one or more materials taken from the group containing silicon carbide, aluminum nitride, beryllium oxide and boron nitride.

19. The system of claim 11 wherein the central portion of said substrate comprises a ceramic material formed in combination with a modifier of the type which increases fracture toughness.

20. The system of claim 19 wherein the ceramic material is 80 percent by volume silicon carbide and the modifier is titanium diboride.

21. The system of claim 10 wherein one printed wiring board is bonded to each substrate surface, the ceramic central portion is 0.05 in. thick, the total substrate thickness is 0.08 in. and the lowest resonant frequency in the substrate is greater than 460 Hertz.

22. The system of claim 10 wherein the metal layers comprise aluminum.

23. The system of claim 10 wherein the metal layers are each an alloy of aluminum.

* * * * *